(12) United States Patent
Watanabe et al.

(10) Patent No.: US 8,770,725 B2
(45) Date of Patent: *Jul. 8, 2014

(54) METHOD OF MANUFACTURING ELECTROMECHANICAL TRANSDUCER ELEMENT, ELECTROMECHANICAL TRANSDUCER ELEMENT, DISCHARGING HEAD, AND INKJET RECORDING DEVICE

(75) Inventors: Yasuhiro Watanabe, Kanagawa (JP); Osamu Machida, Kanagawa (JP); Akira Shimofuku, Kanagawa (JP); Ryo Tashiro, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/612,717

(22) Filed: Sep. 12, 2012

(65) Prior Publication Data

US 2013/0070028 A1  Mar. 21, 2013

(30) Foreign Application Priority Data

Sep. 16, 2011 (JP) .................. 2011-202821
Jan. 6, 2012 (JP) .................. 2012-000950

(51) Int. Cl.
*B41J 2/045* (2006.01)
*H01L 41/22* (2013.01)
*H04R 17/00* (2006.01)

(52) U.S. Cl.
USPC .......................................... 347/68; 29/25.35

(58) Field of Classification Search
None
See application file for complete search history.

(56) References Cited

U.S. PATENT DOCUMENTS

2012/0038712 A1   2/2012  Akiyama et al.

FOREIGN PATENT DOCUMENTS

| JP | 2004-172608 | | 6/2004 |
|---|---|---|---|
| JP | 2005327920 A | * | 11/2005 |
| JP | 2008-012444 | | 1/2008 |
| JP | 2011-009726 | | 1/2011 |
| JP | 2011-018836 | | 1/2011 |

* cited by examiner

*Primary Examiner* — Matthew Luu
*Assistant Examiner* — Erica Lin
(74) *Attorney, Agent, or Firm* — Cooper & Dunham LLP

(57) ABSTRACT

Disclosed is a method of manufacturing an electromechanical transducer element including a first process of hydrophobizing a first area of an electrode by forming a self-assembled monolayer film; a second process of applying a sol-gel solution onto a predetermined second area of the electrode so as to produce a complex oxide; a third process of producing the complex oxide by calcining the electrode; a fourth process of acid-washing the electrode on which the complex oxide has been produced; a fifth process of hydrophobizing the first area of the acid-washed electrode by forming the self-assembled monolayer film; a sixth process of applying the sol-gel solution onto the predetermined second area; and a seventh process of producing the complex oxide by calcining the electrode.

11 Claims, 9 Drawing Sheets

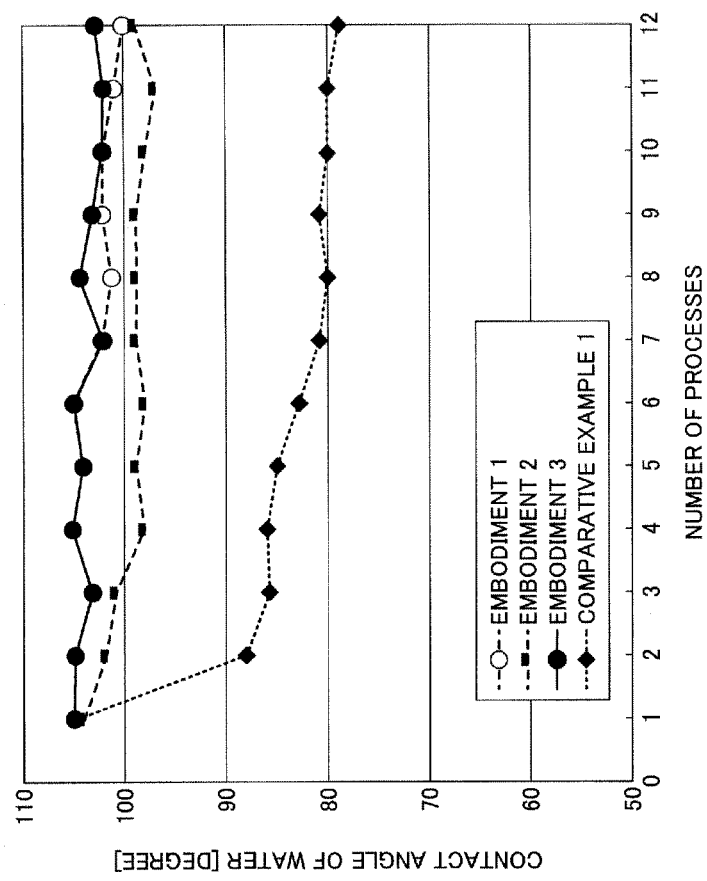

METHOD OF MANUFACTURING ELECTROMECHANICAL TRANSDUCER ELEMENT, ELECTROMECHANICAL TRANSDUCER ELEMENT, DISCHARGING HEAD, AND INKJET RECORDING DEVICE

BACKGROUND OF THE INVENTION

1. Field of the Invention

Embodiments of the present invention relate to a method of manufacturing electromechanical transducer elements, the electromechanical transducer elements, discharging heads, and inkjet recording devices.

2. Description of the Related Art

Inkjet recording devices can print at high speed while generating very little noise. In addition, for such inkjet recording devices, there is a large degree of freedom of selecting ink, and less expensive plain paper may be utilized. Therefore, the inkjet recording devices have been widely adopted as image forming devices such as printers, facsimile machines, and copiers.

A discharge head for an inkjet recording device includes nozzles for discharging ink, liquid chambers that communicates with the corresponding nozzles, and pressure generating units that cause the ink in the corresponding liquid chambers to be discharged. It has been known that an electromechanical transducer element can be utilized as the pressure generating unit.

Patent Document 1 (Japanese Patent Laid-Open Application No. 2011-9726) discloses a method of manufacturing electromechanical transducer elements. The method includes a first manufacturing process, a second manufacturing process, and a third manufacturing process. In the method, the first, second, and third manufacturing processes are repeated. In the first manufacturing process, a self-assembled film is formed on a predetermined area of an electrode, and the self-assembled film is hydrophobized. In the second manufacturing process, a sol-gel solution is applied to an area on the electrode where the self-assembled film has not been formed. In the third manufacturing process, a complex oxide is produced by drying, thermally decomposing, and crystallizing the electrode on which the sol-gel solution has been applied.

However, there is a problem such that, when the number of times of generating the complex oxide is increased, it becomes difficult to hydrophobize the electrode.

SUMMARY OF THE INVENTION

Embodiments of the present invention have been developed in view of the above problem. An objective of the embodiments of the present invention is to provide a method of manufacturing electromechanical transducer elements where an electrode can be hydrophobized even if a number of times of generating a complex oxide is increased; electromechanical transducer elements manufactured by the method; discharging heads including the electromechanical transducer elements; and inkjet recording devices including the electromechanical transducer elements.

In one aspect, there provided a method of manufacturing an electromechanical transducer element. The method includes a first process of hydrophobizing a first area of an electrode by forming a self-assembled monolayer film on the first area, wherein a complex oxide film has been formed on a predetermined second area of the electrode, and the complex oxide film has not been formed on the first area of the electrode on which the self-assembled monolayer film is formed; a second process of applying a sol-gel solution onto the predetermined second area of the electrode where the self-assembled monolayer film has not been formed, wherein the sol-gel solution is adjusted to produce the complex oxide; a third process of producing the complex oxide by calcining the electrode to which the sol-gel solution has been applied; a fourth process of acid-washing the electrode on which the complex oxide has been produced; a fifth process of hydrophobizing, by forming the self-assembled monolayer film, the first area of the acid-washed electrode on which the complex oxide film has not been formed; a sixth process of applying the sol-gel solution onto the predetermined second area where the self-assembled monolayer film has not been formed, wherein the sol-gel solution is adjusted to produce the complex oxide; and a seventh process of producing the complex oxide by calcining the electrode on which the sol-gel solution has been applied.

In another aspect, there is provided an electromechanical transducer element that is formed by the method of manufacturing the electromechanical transducer element.

In another aspect, there is provided a discharging head including the electromechanical transducer element.

In another aspect, there is provided an inkjet recording device including the discharging head.

According to the embodiments of the present invention, the method of manufacturing the electromechanical transducer element can be provided where the electrode can be hydrophobized even if the number of times of generating the complex oxide is increased. Additionally, there can be provided the electromechanical transducer elements manufactured by the method, discharging heads including the electromechanical transducer elements, and the inkjet recording devices including the electromechanical transducer elements.

Other objects, features and advantages of the present invention will become more apparent from the following detailed description when read in conjunction with the accompanying drawings.

BRIEF DESCRIPTION OF THE DRAWINGS

FIG. 8 shows a relationship between a number of processes for forming the complex oxide films (and thereby forming the complex oxide film laminated body) and a contact angle of water on an area of a common electrode where a self-assembled monolayer film has been formed but no complex oxide films have been formed.

DETAILED DESCRIPTION OF THE PREFERRED EMBODIMENTS

Hereinafter, an embodiment of the present invention will be explained while referring to the accompanying figures.

FIG. 1 shows an example of a method of manufacturing an electromechanical transducer film according to the embodiment.

Figure 1A:
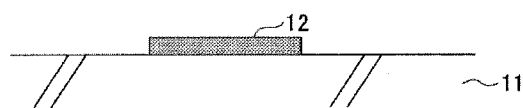
FIGS. 1A-1D are cross-sectional views illustrating a method of manufacturing an electromechanical transducer element according to an embodiment.

A complex oxide film 12 has been formed on a predetermined area of a common electrode 11 (cf. FIG. 1A). A self-assembled monolayer (SAM) film 13 is formed on an area on the common electrode 11 where the complex oxide film 12 has not been formed, and thereby hydrophobizing the area on the common electrode 11 where the complex oxide film 12 has not been formed (cf. FIG. 1B).

A material of the common electrode 11 is not limited, provided that the self-assembled monolayer film 13 can be formed on the common electrode 11. Examples of the material of the common electrode 11 include a platinum group metal such as platinum, rhodium, ruthenium, and iridium; and a platinum group alloy such as a platinum-rhodium alloy. Especially, platinum is preferable.

The common electrode 11 may be a laminated body such that a film of a platinum group metal or a film of a platinum group alloy is formed on a film of a conductive metal oxide.

The conductive metal oxide is not limited to a particular material. However, examples of the conductive metal oxide include $SrRuO_3$, $CaRuO_3$, $(Sr_{1-x}Ca_x)RuO_3$, $LaNiO_3$, $SrCoO_3$, $(La_{1-y}Sr_y)(Ni_{1-y}Co_y)O_3$, $IrO_2$, and $RuO_2$.

Thickness of the common electrode 11 is usually in a range from 0.05 μm to 2 μm.

The common electrode 11 is usually formed on a substrate such as a silicone wafer. However, the common electrode 11 itself may be the substrate.

The method of forming the common electrode 11 on the substrate is not limited to a particular method. However, examples of the forming the common electrode 11 on the substrate include the sputtering method, and the evaporation method.

The method of forming the complex oxide film 12 on a predetermined area of the common electrode 11 is not limited to a particular method. However, examples of the method include a method in which the complex oxide film 12 is formed by etching the unnecessary complex oxide film after forming a photo-resist pattern on the common electrode 11, where the complex oxide film is formed on the entire surface of the common electrode 11; and a method in which the complex oxide film 12 is formed after forming a photo-resist pattern on the common electrode 11.

The method of forming the complex oxide film 12 on the common electrode 11 is not limited to a particular method. However, examples of the method of forming the complex oxide film 12 on the common electrode 11 include the sputtering method and the evaporation method.

When the complex oxide film 12 is formed on the entire surface of the common electrode 11, a sol-gel solution is applied onto the common electrode 11 by using the spin coating method, and subsequently the common electrode 11 may be calcined.

The photo-resist is not limited to a particular photo-resist. However, examples of the photo-resist include polycinnamic acid vinyl; a cyclized rubber-bisazide resist; a negative resist included in cross-link-type chemically amplified resists, such as a resist formed of polyvinyl phenol/a crosslinking agent such as melamine/and an acid-generating agent; a quinone diazide-novolak resin-based resist; a positive resist included in protection group desorption or dissolution preventing type chemically amplified resists, such as a resist formed of an acetalized polyvinylphenol and an acid-generating agent.

The method of applying the photo-resist is not limited to a particular method. However, for example, the spin-coating method, the dipping method, the cast method, the spray coating method, the die coating method, the screen printing, and a doctor blade method can be considered.

The thickness of the photo-resist is usually in a range from 0.5 μm to 10 μm.

A light source that is utilized for exposing light to the photo-resist is not limited to a particular light source. However, for example, a halogen lamp, a high-pressure mercury lamp, a UV lamp, and an excimer laser may be considered.

The light exposed to the photo-resist preferably has a wavelength in a range from 100 nm to 500 nm. The ultraviolet light is especially preferable.

A developer used for developing the photo-resist is not limited to a particular developer. However, for example, water, an alkali aqueous solution, and an organic solvent may be considered. Two or more of them may be used at the same time.

The method of etching the unnecessary complex oxide film is not limited to a particular method. However, the argon plasma processing may be considered, for example.

The solvent used for removing the photo-resist not limited to a particular solvent. However, for example, acetone, tetrahydrofuran, and N-methylpyrrolidone may be considered.

Additionally, the complex oxide film 12 may be formed on the predetermined area of the common electrode 11 by using a method described in FIGS. 1-5 of Patent Document 1.

Further, after forming the complex oxide film 12 on the common electrode 11, the common electrode 11 may be acid washed as described later.

The complex oxide included in the complex oxide film 12 is not limited to a particular material, provided that the electromechanical transducer film may be formed with the complex oxide. However, for example, a chemical compound expressed by a general formula $ABO_3$ may be considered. In the formula, A is one or more elements selected from a group including Pb, Ba, and Sr. B is one or more elements selected from a group including Ti, Zr, Sn, Ni, Zn, Mg, and Nb. Especially, lead zirconate titanate (PZT) is preferable.

Lead zirconate titanate is a solid solution of lead zirconate ($PbZrO_3$) and lead titanate ($PbTiO_3$). The chemical property of lead zirconate titanate depends on a ratio between the lead zirconate and lead titanate. From the viewpoint of the electromechanical transducing property, $Pb(Zr_{0.53},Ti_{0.47})O_3$ is preferable.

Specific examples of the complex oxide other than lead zirconate titanate include, for example, barium titanate, $(Pb_{1-x}Ba_x)(Zr,Ti)O_3$, and $(Pb_{1-x}Sr_x)(Zr,Ti)O_3$.

The thickness of the complex oxide film 12 is usually 100 nm. When the thickness of the complex oxide film 12 becomes large, it is possible that cracking occurs during the baking process of a complex oxide laminated body, which will be described later.

When the self-assembled monolayer film 13 is formed on the common electrode 11, it is preferable that a thiol or a solution of a thiol be applied from a nozzle to the common electrode 11.

The thiol is not limited to a specific thiol, provided that the self-assembled monolayer film 13 may be formed on the common electrode 11 with the thiol. However, for example, a straight chain alkane thiol having a carbon number of 6-30 may be considered.

The method of applying the thiol or the the thiol is not limited to a specific method. However, for example, the dipping method may be considered.

The solvent included in the solution of the thiol is not limited to a particular solvent. However, for example, ethanol, isopropanol, and toluene may be considered.

After the thiol or the solution of the thiol has been applied to the common electrode 11, the common electrode 11 is washed with a cleaning solution.

The cleaning solution is not limited to a particular cleaning solution, provided that the thiol that is not forming the self-assembled monolayer film 13 can be removed with the cleaning solution. For example, ethanol, isopropanol, and toluene may be considered.

The method of washing the common electrode 11, to which the thiol or the solution of the thiol has been applied, with the cleaning solution is not limited to a particular method. However, for example, a method may be considered in which the cleaning solution is applied from a nozzle onto the common electrode 11. It is preferable to spray the cleaning solution, to which ultrasonic waves have been applied, from the nozzle to the common electrode 11. The reason is that the thiol that is not forming the self-assembled monolayer film 13 may easily be removed with the cleaning solution in such a condition.

The frequency range of the ultrasonic waves applied to the cleaning solution is usually from 20 kHz to 1 MHz.

Figure 1B:
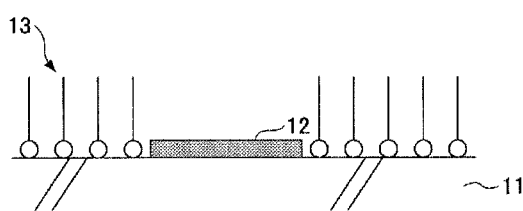
Figure 1C:
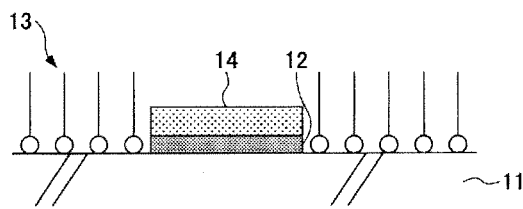

Next, a sol-gel solution 14 is applied to an area on the common electrode 11 where the self-assembled monolayer film 13 has not been formed (cf., FIG. 1C). The complex oxide can be formed with the sol-gel solution 14.

When the complex oxide is lead zirconate titanate, the sol-gel solution 14 may be prepared by dissolving lead acetate, zirconate alkoxide, titanalkoxide into methoxyethanol.

The sol-gel solution 14 may further include a stabilizing agent such as acetylacetone, acetic acid, and diethanolamine, so as to prevent a metalalkoxide from being hydrolyzed by moisture in the air.

When the complex oxide is barium titanate, the sol-gel solution 14 may be prepared by dissolving barium alkoxide and titanalkoxide into methoxyethanol.

The method of applying the sol-gel solution 14 is not limited to a particular method. However, an inkjet method can be considered, for example.

Figure 1D:
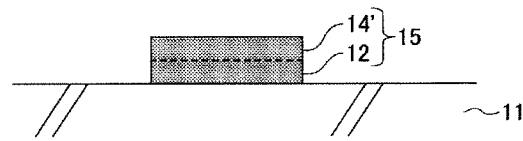

Next, the common electrode 11 to which the sol-gel solution 14 has been applied is calcined to form a complex oxide film 14', and thereby forming a complex oxide film laminated body 15 (cf. FIG. 1D). At this time, the self-assembled monolayer film 13 is removed.

The temperature for calcining the common electrode 11 to which the sol-gel solution 14 has been applied is usually in a range from 300 degrees Celsius to 1400 degrees Celsius. It is preferable that the temperature be in a range from 450 degrees Celsius to 1200 degrees Celsius. At this time, the temperature may be increased stepwise.

The time interval for calcining the common electrode 11 to which the sol-gel solution 14 has been applied is usually in a range from 2 hours to 24 hours.

The atmosphere for calcining the common electrode to which the sol-gel solution 14 has been applied may be any one of an inert gas atmosphere and an atmosphere including oxygen such as the air. At this time, the pressure of the atmosphere may be normal pressure. Alternatively, the pressure may be reduced.

The thickness of the complex oxide film 14' is usually about 100 nm. When the thickness of the complex oxide film 14 becomes too large, cracking may occur during baking of the complex oxide film laminated body (which will be described later).

Subsequently, the electrode 11, on which the complex oxide film laminated body 15 has been formed, is acid-washed.

An acid or a solution of an acid that is utilized for acid-washing the electrode 11, on which the complex oxide film laminated body 15 has been formed, is not limited to a specific acid or a specific solution of an acid. However, for example, hydrogen chloride or acetic acid may be utilized.

The method of acid-washing the electrode 11, on which the complex oxide film laminated body 15 has been formed, is not limited to a specific method. However, for example, a method of spraying the acid or the solution of the acid from a nozzle to the common electrode 11 can be utilized.

It is preferable that the pH of the acid or the solution of the acid at 25 degrees Celsius be in a range from 2 to 5. It is more preferable that the pH be in a range from 2 to 4, and it is most preferable that the pH be in a range from 3 to 4. When the pH of the acid or the solution of the acid at 25 degrees Celsius is less than 2, dielectric loss of the complex oxide film laminated body is increased, and the electromechanical transducing property of the electromechanical transducer element may be degraded. On the other hand, when the pH of the acid or the solution of the acid at 25 degrees Celsius is greater than 5, an oxide may remain on the surface of the common electrode 11, and it may become difficult to hydrophobize the common electrode 11. Therefore, the form accuracy of the complex oxide film laminated body may be lowered.

The acid-washed common electrode 11 is usually washed by a cleaning solution.

The cleaning solution is not limited to a specific cleaning solution, provided that the cleaning solution can remove the acid. However, examples of the cleaning solution include water, isopropanol, and ethanol.

The method of washing the acid-washed common electrode 11 with the cleaning solution is not limited to a specific method. However, for example, a method can be considered in which the cleaning solution is sprayed from a nozzle to the common electrode 11.

Subsequently, similar to the case of FIGS. 1B-1D, another complex oxide film 14' is laminated on the complex oxide film laminated body 15.

After the common electrode 11, on which the complex oxide film laminated body 15 has been formed, is acid-washed, the process of laminating the complex oxide film 14' is repeated until the thickness of the complex oxide film laminated body 15 becomes a predetermined value. At this time, upon the thickness of the complex oxide film laminated body 15 becoming the predetermined value, the complex oxide film laminated body 15 is baked.

The temperature for baking the common electrode 11, on which the complex oxide film laminated body 15 has been formed, is usually in a range from 300 degrees Celsius to 1400 degrees Celsius. It is preferable that the temperature be in a range from 450 degrees Celsius to 1200 degrees Celsius. At this time, the temperature may be increased stepwise.

The time interval for baking the common electrode 11, on which the complex oxide film laminated body 15 has been formed is usually in a range from 3 minutes to 24 hours.

The atmosphere for baking the common electrode 11, on which the complex oxide film laminated body 15 has been formed may be any one of an inert gas atmosphere or an atmosphere including oxygen such as the air. At this time, the pressure of the atmosphere may be normal pressure. Alternatively, the pressure may be reduced.

The thickness of the complex oxide film laminated body 15 is usually in a range from 1 μm to 5 μm.

Subsequently, an individual electrode is formed on the complex oxide film laminated body 15, and thereby the electromechanical transducer element according to the embodiment is obtained.

A material of the individual electrode is not limited to a specific material. However, examples of the material of the individual electrode include a platinum group metal such as platinum, rhodium, ruthenium, and iridium; a platinum group alloy such as a platinum-rhodium alloy; and a conductive metal oxide such as $SrRuO_3$, $CaRuO_3$, $(Sr_{1-x}Ca_x)RuO_3$, $LaNiO_3$, $SrCoO_3$, $(La_{1-y}Sr_y)(Ni_{1-y}Co_y)O_3$, $IrO_2$, and $RuO_2$.

The thickness of the individual electrode is usually in a range from 0.05 µm to 2 µm.

A method of forming the individual electrode on the complex oxide film laminated body 15 is not limited to a specific method. However, examples of the method of forming the individual electrode include a method similar to the method of forming the complex oxide film 12 on the predetermined area of the common electrode 11; and a method that is similar to the method shown in FIGS. 1B-1D.

After forming the complex oxide film laminated body 15 on the common electrode 11, the common electrode 11 may be acid-washed as described above, prior to forming the individual electrode.

Figure 2:
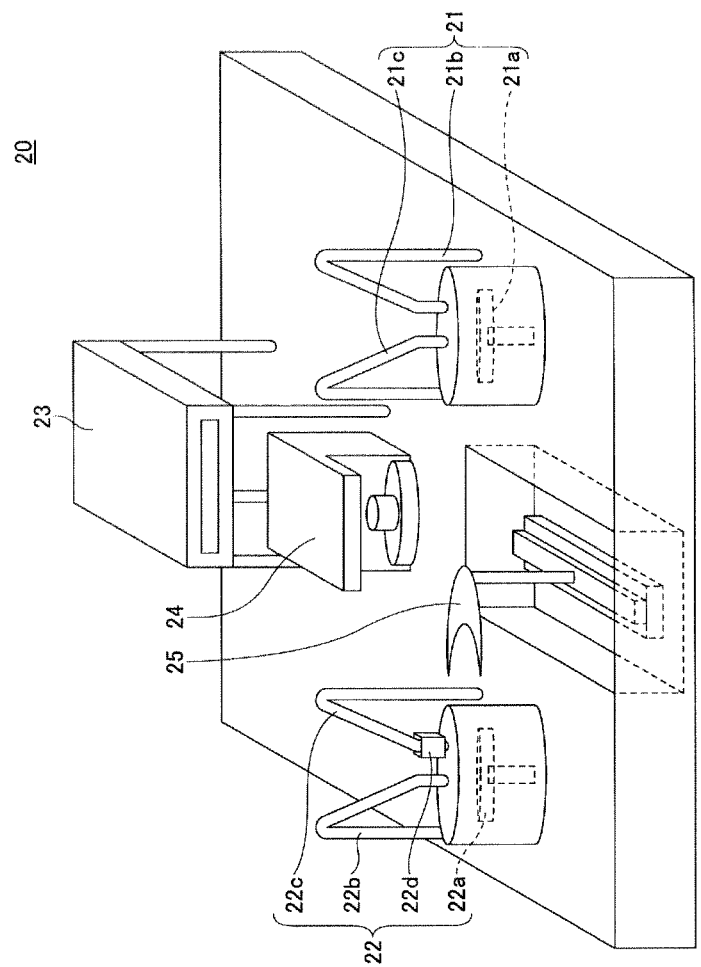
FIG. 2 is a perspective view showing an example of a self-assembled monolayer film forming apparatus.

FIG. 2 shows an example of a self-assembled monolayer film forming apparatus 20 that is utilized for forming the self-assembled monolayer film 13. The self-assembled monolayer film forming apparatus includes an acid-washing chamber 21; a self-assembled monolayer film forming chamber 22; a hot plate 23; an aligner 24; and a robot arm 25.

The acid-washing chamber 21 includes a spinner chuck 21a; an acid nozzle 21b; and a cleaning solution nozzle 21c. Further, the self-assembled monolayer film forming chamber 22 includes a spinner chuck 22a; a self-assembled monolayer film nozzle 22b; a cleaning solution nozzle 22c: and an ultrasonic generator 22d.

A method of fixing the common electrode 11 on the spinner chucks 21a and 22a is not limited to a particular method. However, a vacuum method and a pinning method may be considered. Especially, the vacuum method is preferable.

The hot plate 23 is used for drying the common electrode 11, after the common electrode 11 has been acid-washed.

The aligner 24 is used for aligning the disposed common electrode 11 to a predetermined position.

The robot arm 25 is used for moving the common electrode 11.

Next, there will be explained the method of forming the self-assembled monolayer film 13 on the area of the common electrode 11 where the complex oxide film laminated body 15 is not formed. Here, the complex oxide film laminated body 15 has been formed on the other area of the common electrode 11.

First, the common electrode 11 is disposed in the aligner 24. Here, the complex oxide film 12 has been formed on the predetermined area of the common electrode 11. The aligner 24 aligns the common electrode 11 to a predetermined position. Subsequently, the robot arm 25 moves the common electrode 11 inside the acid-washing chamber 21, and fixes the common electrode 11 to the spinner chuck 21a. Further, after the common electrode 11 has been acid-washed by spraying it with the acid or the solution of the acid from the acid nozzle 21b, the common electrode 11 is washed by spraying it with the cleaning solution from the washing liquid nozzle 21, while the common electrode 11 is rotated. Then, the robot arm 25 moves the common electrode 11 onto the hot plate 23. The common electrode 11 is dried. Further, the robot arm 25 moves the common electrode 11 inside the self-assembled monolayer film forming chamber 22, and the robot arm 25 fixes the common electrode to the spinner chuck 22a. After the self-assembled monolayer film 13 has been formed on the common electrode 11 by spraying it with the thiol or the solution of the thiol from the self-assembled monolayer film nozzle 22b, the common electrode 11 is washed by spraying it with the cleaning solution from the cleaning solution nozzle 22c, while the common electrode 11 is rotated. At this time, the ultrasonic generator 22d applies ultrasonic waves to the cleaning solution. After that, the robot arm 25 moves the common electrode 11 to the aligner 24. Then, the common electrode 11 is retrieved.

Additionally, when the self-assembled monolayer film 13 is formed on the area of the common electrode 11 where the complex oxide film 12 has not been formed (the complex oxide film 12 has been formed on the other area of the common electrode), the self-assembled monolayer film forming apparatus 20 may be used.

Furthermore, after the complex oxide film laminated body 15 has been formed on the common electrode 11, the self-assembled monolayer film forming apparatus 20 may be used for acid-washing the common electrode 11, prior to forming the individual electrode.

The discharging head according to the embodiment is not limited to a particular discharging head, provided that the discharging head includes the electromechanical transducer element according to the embodiment. However, examples of the discharging head include an inkjet head and a micropump.

Figure 3:
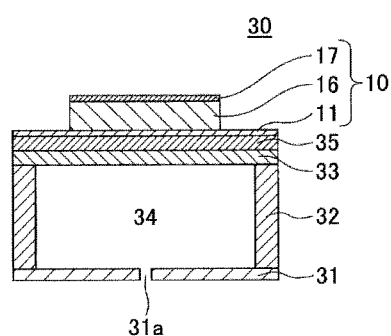
FIG. 3 is a cross-sectional view showing an example of a discharging head according to the embodiment.

FIG. 3 shows an inkjet head 30 as an example of the discharging head according to the embodiment. In the inkjet head 30, a liquid chamber 34 has been formed by laminating a nozzle plate 31 in which a nozzle 31a has been formed, a liquid chamber substrate 32, and an oscillation plate 33, in this order. Further, in the inkjet head 30, an electromechanical transducer element 10 has been formed by laminating, through an adhesive layer 35, the common electrode 11, a complex oxide film laminated body 16, and the individual electrode 17, in this order, at an area on the oscillation plate 33 that corresponds to the liquid chamber 34.

A material that forms the nozzle plate 31 is not limited to a particular material. However, examples of the material of the nozzle plate 31 include a stainless steel and a polyimide.

A method of forming the liquid chamber substrate 32 is not limited to a particular method. However, for example, a method may be considered in which a silicone wafer that forms the oscillation plate 33, the adhesive layer 35, and the electromechanical transducer element 10 is etched.

The thickness of the liquid chamber substrate 32 is usually in a range from 100 µm to 600 µm.

Examples of a material of the oscillation plate 33 include silicon oxide; silicon nitride; silicon nitride oxide; aluminum oxide; zirconium oxide; iridium oxide; ruthenium oxide; tantalum oxide; hafnium oxide; osmium oxide; rhenium oxide; rhodium oxide; and palladium oxide. Two or more of the above materials may be used at the same time.

A method of forming the oscillation plate 33 is not limited to a particular method. However, for example, the sputtering method and the evaporation method may be considered.

The thickness of the oscillation plate 33 is usually in a range from 0.1 µm to 10 µm. It is preferable that the thickness be in a range from 0.5 µm to 3 µm.

A material of the adhesive layer 35 is not limited to a particular material. However, for example, titanium; tantalum; titanium oxide; tantalum oxide; titanium nitride; and tantalum nitride may be considered. Two or more of the above materials may be used at the same time.

Here, the adhesive layer 35 may be omitted depending on the cases.

Figure 4:
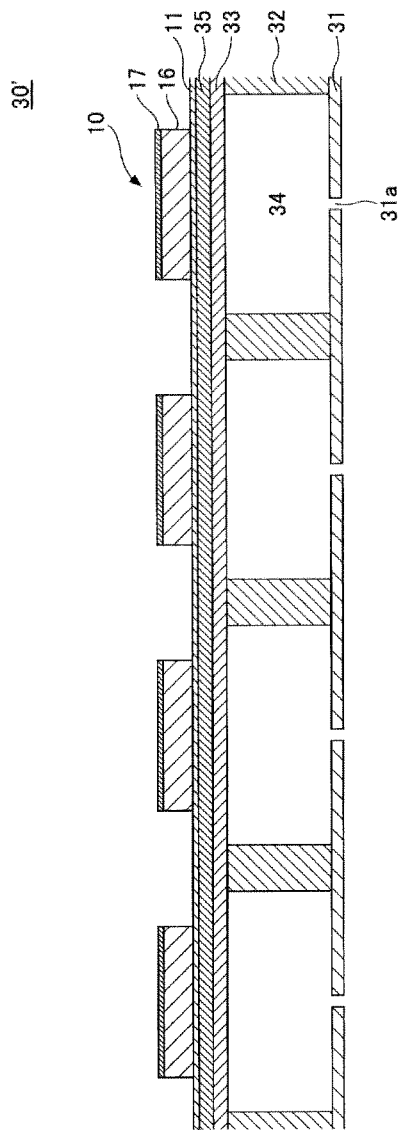
FIG. 4 is a cross-sectional view showing another example of the discharging head according to the embodiment.

FIG. 4 shows an inkjet head 30' as another example of the discharging head according to the embodiment. The inkjet head 30' has a configuration that is the same as that of the inkjet head 30, except for that the plural electromechanical transducer elements 10, the nozzles 31a, and the liquid chambers 34 are arranged in a line.

Figure 5A:
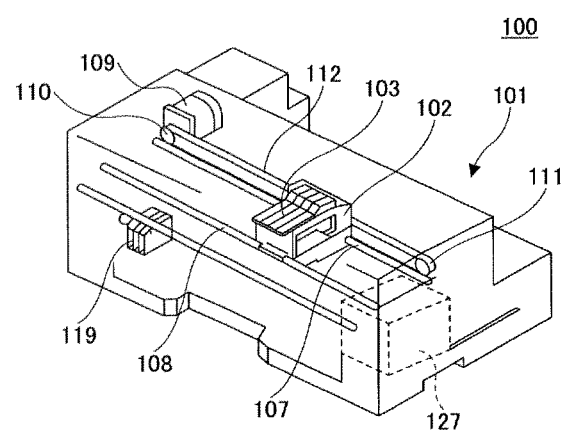
FIG. 5A is a perspective view showing an inkjet recording ice according to the embodiment.
Figure 5B:
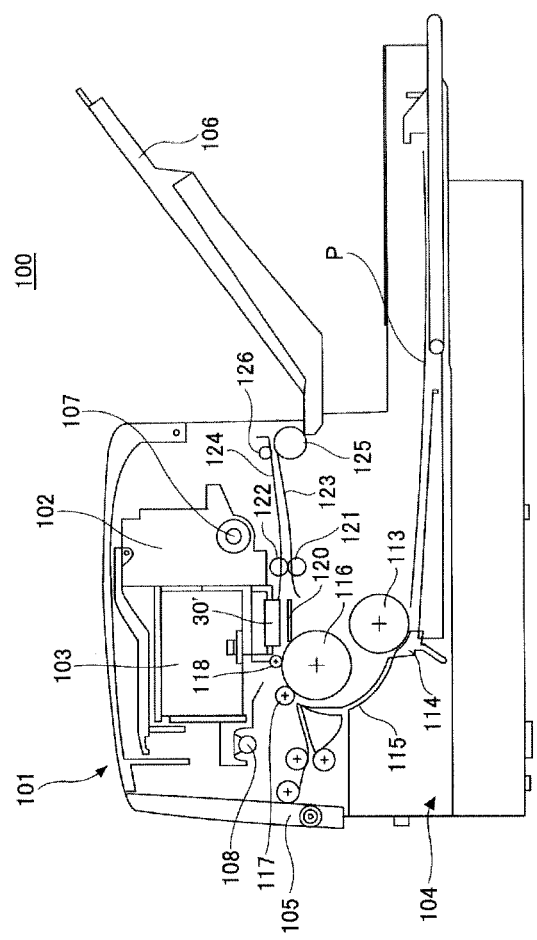
FIG. 5B is a side view showing the inkjet recording device according to the embodiment.

FIGS. 5A and 5B show an example of an inkjet recording device according to the embodiment. FIG. 5A is a perspective view of the inkjet recording device. FIG. 5B is a side view of the recording device.

A main body 101 of the inkjet recording device 100 includes a carriage that can be moved in a main scanning direction; the inkjet head 30 mounted on the carriage 102; and an ink cartridge 103. Additionally, a paper feed cassette 104 that can store sheets of paper P can be detachably attached to the inkjet recording device 100 from a front side of a lower portion of the main body 101, and the inkjet recording device 100 includes an openable and closeable manual feed tray 105 for manually feeding the sheets of paper P. Further, after an image has been formed on the sheet of paper P that has been fed from the paper feed cassette 104 or from the manual feed tray 105, the inkjet recording device 100 discharges the sheet of paper P on a paper discharge tray 106.

The carriage 102 is held by a main guide rod 107 and a sub-guide rod 108, so that carriage 102 can be slid in the main scanning direction. The main guide rod 107 and the sub-guide rod 108 are supported by left and right side plates (not shown). The inkjet head 30 that discharges yellow (Y) ink, cyan (C) ink, magenta (M) ink, and black (Bk) ink is attached to the carriage 102, so that the inkjet head 30' discharges the ink downward. At this time, the inkjet head 30' is arranged so that the plural electromechanical transducer elements 10, the nozzles 31a, and the liquid chambers 34 are arranged in a line in a direction that intersects the main scanning direction. Additionally, the ink cartridges 103 are replaceably attached to the carriage 102. The ink cartridges 103 supply the ink having the corresponding colors to the inkjet head 30'.

Each of the ink cartridge 103 includes an air inlet (not shown) that communicates with the air outside and that is formed at an upper portion of the ink cartridge 103; a supply port (not shown) that supplies the ink to the inkjet head 30' and that is formed at a lower portion of the ink cartridge 103; and a porous body (not shown) that is filled with the ink and that is disposed inside the ink cartridge 103. At this time, the ink supplied to the inkjet head 30' is maintained to have slightly negative pressure by a capillary force of the porous body.

Here, instead of arranging the inkjet head 30' that discharges the ink in the corresponding colors, the inkjet head 30 that discharges the yellow ink, the inkjet head 30 that discharges the cyan ink, the inkjet head 30 that discharges the magenta ink, and the inkjet head 30 that discharges the black ink may be attached to the carriage 102.

A portion of the carriage 102 at a downstream side in the direction in which the sheet of paper P is conveyed is slidably supported by the main guide rod 107. Another portion of the carriage 102 at an upstream side in the direction in which the sheet of paper P is conveyed is slidably supported by the sub-guide rod 108. A timing belt 112 is suspended between a drive pulley 110 and a driven pulley 111. The drive pulley 110 is rotationally driven by a main scanning motor 109. The carriage 102 is fixed to the timing belt 112. Therefore, the carriage 102 can be reciprocated in the main scanning direction by the rotation of the main scanning motor 109.

The inkjet recording device 100 includes a paper feed roller 113 and a friction pad 114 that separate the sheets of paper P and that feed the sheets of paper P on a sheet-by-sheet basis; a guide member 115 that guides the sheet of paper P that has been fed; a conveyance roller 116 that conveys the sheet of paper P which has been fed, while inverting the sheet of paper P; a conveyance roller 117 that is pressed onto a circumferential surface of the conveyance roller 116; and a tip roller 118 that defines an angle in which the sheet of paper P is sent out from the conveyance roller 116, so as to convey the sheets of paper P stacked on the paper feed cassette 104 to a portion below the inkjet head 30' on a sheet-by-sheet basis. The conveyance roller 116 is rotationally driven by a sub-scanning motor 119 through a sequence of gears (not shown).

The inkjet recording device 100 includes a guide member 120 that guides the sheet of paper P, which has been conveyed by the conveyance roller 116, at the position below the inkjet head 30'. The inkjet recording device 100 includes a conveyance roller 121 and a spur 122 that are rotationally driven so as to convey the sheet of paper P in a paper discharging direction. The conveyance roller 121 and the spur 122 are disposed at a downstream side of the guide member 120 in the direction in which the sheet of paper P is conveyed. The inkjet recording device 100 further includes guide members 123 and 124 that guide the sheet of paper P that has been conveyed by the conveyance roller 121 and the spur 122; and a paper discharging roller 125 and a spur 126 that discharge the sheet of paper P, which has been guided by the guide members 123 and 124, onto the paper discharge tray 106.

When the inkjet recording device 100 records an image on the sheet of paper P, the inkjet recording device 100 drives the inkjet head 30' in accordance with an image signal, while moving the carriage 102. In this manner, the inkjet recording device 100 causes the inkjet head 30' to discharge the ink onto the staying sheet of paper P and records an amount corresponding to one line. After that, the inkjet recording device 100 repeats the operation to convey the sheet of paper P. When the inkjet recording device 100 receives a recording termination signal or a signal indicating that a rear end of the sheet of paper P reaches a recording area, the inkjet recording device 100 terminates the recording operation, and discharges the sheet of paper P.

The inkjet recording device 100 includes a recovering device 127 that recovers the inkjet heads 30' from a discharging failure. The recovering device 127 is disposed at a position outside the recording area at the right end side with respect to the moving direction of the carriage 102. The recovering device 127 includes a cap unit (not shown); a suction unit (not shown); and a cleaning unit (not shown). During a waiting state, the carriage 102 moves toward the recovering device 127, and the cap unit caps the inkjet head 30'. In this manner, the wet conditions of the nozzles are maintained, and a discharging failure caused by drying of the ink is prevented. Further, during recording, the inkjet recording device 100 discharges ink that not related to the recording. In this manner, the viscosity of the ink at the nozzles is homogenized, and a stable discharging capability is maintained.

When the discharging failure occurs in the inkjet recording device 100, the nozzles of the inkjet heads 30' are sealed by the cap unit. The ink and bubbles are suctioned from the nozzles by the suction unit through a tube. The ink and dust adhering to the nozzles are removed by a cleaning unit, and thereby the discharging failure is recovered. At this time, the ink suctioned by the suction unit is discharged to a waste ink reservoir (not shown) disposed at a lower portion of the main body 101, and the ink is absorbed by an ink absorber disposed inside the waste ink reservoir.

Hereinafter, there will be explained embodiments 1-3 of the present invention.

Embodiment 1

After forming a thermal oxide film (the oscillation plate 33) having a thickness of 1 µm on a silicone wafer having a thickness of 725 µm, a titanium film (the adhesive layer 35) having the thickness of 50 nm was formed by using the sputtering method. Subsequently, a platinum film (the common electrode 11) having a thickness of 200 nm was formed by the sputtering method, and after that, a PZT film having a thickness of 100 nm was formed by the sol-gel method. Further, a pattern of the photo-resist TSMR8800 (produced by Tokyo Ohka Kogyo Co., Ltd.) having a thickness of 1.2 µm was formed on the common electrode 11, and after that, the PZT film (the complex oxide film 12) was formed by etching an unnecessary PZT film by the argon plasma processing, and the photo-resist was removed.

Next, the self-assembled monolayer film 13 was formed on an area of the common electrode 11, where the complex oxide film 12 had not been formed, by using the self-assembled monolayer film forming apparatus 20 (cf. FIG. 2). Specifically, first, the common electrode 11 was sprayed with a 0.01 mol/L dodecanethiol ethanol solution from the self-assembled monolayer film nozzle 22b, and the common electrode 11 was allowed to stand for five minutes. Next, the silicon wafer, on which the common electrode 11 had been formed, was washed by spraying it with ethanol from the cleaning solution nozzle 22c for two minutes at a rate of 600 mL/min, while the silicon wafer was rotated at 500 rpm so as to remove the dodecanethiol ethanol solution. At that time, the ultrasonic generator 22d was applying ultrasonic waves of 1 MHz to ethanol. After that, ethanol adhering to the silicone wafer, on which the common electrode 11 had been formed, was removed by rotating the silicone wafer at 1500 rpm, without spraying it with ethanol from the cleaning solution nozzle 22c.

Next, liquid repellency of the common electrode 11 was evaluated by using a contact angle gauge, so as to confirm that the self-assembled monolayer film 13 had been formed on the area of the common electrode 11, where the complex oxide film 12 had not been formed. It was found that the contact angle of water on the area of the common electrode 11, where the self-assembled monolayer film 13 had been formed but the complex oxide film 12 had not been formed, was 105 degrees both at the center portion and at a periphery. In addition, it was found that the contact angle of methoxyethanol on the area was 73 degrees both at the center portion and at the periphery. On the other hand, it was found that, prior to forming the self-assembled monolayer film 13, the contact angles of water and methoxyethanol on the area of the common electrode 11, where the complex oxide film 12 had not been formed, were less than or equal to 5 degrees both at the center portion and at the periphery. By these results, it was confirmed that the self-assembled monolayer film 13 had been formed both at the center portion and at the periphery of the area of the common electrode 11, where the complex oxide film 12 had not been formed.

Furthermore, it was found that the contact angles of water and methoxyethanol on the other area of the common electrode 11, where the complex oxide film 12 had been formed, were 5 degrees. By these results, it was confirmed that the self-assembled monolayer film 13 had not been formed on the other area of the common electrode 11, where the complex oxide film 12 had been formed.

Next, the sol-gel solution 14 was applied to the other area of the common electrode 11, where the self-assembled monolayer film 13 had not been formed, by using an inkjet device.

At that time, the sol-gel solution 14 was synthesized as follows. First, lead acetate trihydrate was dissolved into methoxyethanol, and after that a methoxyethanol solution of lead acetate was prepared by dehydrating the resultant solution. Next, tetraisopropoxy titanium and tetraisopropoxy zirconium were dissolved into methoxyethanol and the resultant solution was dehydrated. Then, the dehydrated solution was mixed with the methoxyethanol solution of lead acetate, and thereby a precursor sol (the sol-gel solution 14) of 0.1 mol/L of $Pb(Zr_{0.53},Ti_{0.47})O_3$ was obtained.

Here, in order to prevent degradation of crystallinity caused by insufficient lead, lead acetate was added so that an amount of lead was adjusted to exceed 10% mole fraction the amount of lead defined by the stoichiometric composition.

Next, the silicone wafer, on which the sol-gel solution 14 had been applied, was dried at 120 degrees Celsius, and subsequently the silicone wafer was calcined at 500 degrees Celsius. In this manner, the complex oxide film 14' was formed, and the complex oxide laminated body 15 was formed. At that time, the contact angles of water and methoxyethanol on the area of the common electrode 11, where the complex oxide film 12 had not been formed, were less than 5 degrees. By these results, it was confirmed that the self-assembled monolayer film 13 did not exist on the area of the common electrode 11, where the complex oxide film 12 had not been formed.

Further, the area of the common electrode 11, where the complex oxide film 12 had not been formed, was analyzed by using an X-ray photoelectron spectroscopic device.

Figure 6:
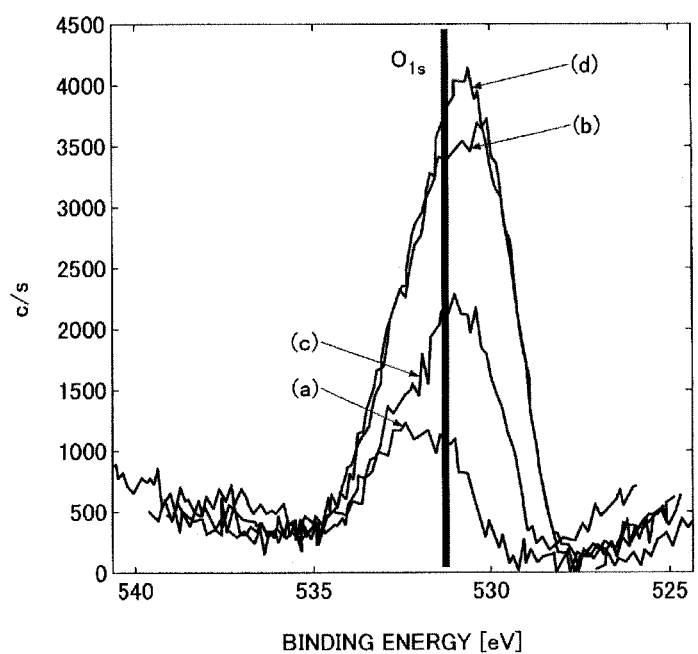
FIG. 6 is a diagram showing an analyzing result of an $O_{1s}$ peak by an X-ray photoelectron spectroscopy.

FIG. 6 shows an analyzing result of an $O_{1s}$ peak by an X-ray photoelectron spectroscopy. In FIG. 6, (a) is an analyzing result after forming the common electrode 11, (b) is an analyzing result after calcining the common electrode 11, (c) is an analyzing result after acid-washing the common electrode 11, and (d) is an analyzing result after calcining the common electrode 11 five times, without acid-washing. From (a) and (b) of FIG. 6, it can be found that, after the common electrode 11 had been calcined, an oxygen content was increased on the area of the common electrode 11, where the complex oxide film 12 had not been formed. Further, from (b) and (d) of FIG. 6, it can be found that an increasing rate of the oxygen content was decreased after calcining the common electrode 11 five times. Therefore, it is considered that there is a saturation state with respect to the oxygen content. Here, the oxygen content was increased because oxygen was adsorbed on the surface of platinum.

Next, the silicon wafer, on which the complex oxide film laminated body 15 had been formed, was acid-washed by using the self-assembled monolayer film forming apparatus 20 (cf. FIG. 2). Specifically, an acetic acid aqueous solution having a pH of 3.3 was sprayed to the common electrode 11 from the acid nozzle 21b, and the common electrode 11 was allowed to stand for one minute. Subsequently, the silicon wafer, on which the complex oxide film laminated body 15 had been formed, was washed by spraying it with water from the cleaning solution nozzle 21c, while removing the acetic acid aqueous solution by rotating the silicone wafer at 500 rpm. Further, water adhering to the silicon wafer, on which the complex oxide film laminated body 15 had been formed, was removed by rotating the silicon wafer at 1500 rpm, without spraying it with water from the cleaning solution nozzle 21c.

Here, the pH of the acetic acid aqueous solution was measured at 25 degrees Celsius by the glass electrode.

Next, the acid-washed silicon wafer was dried by using the self-assembled monolayer film forming apparatus 20 (cf. FIG. 2). Specifically, the silicon wafer, which had been acid-washed, was moved onto the hot plate 23, and the silicone wafer was dried at 120 degrees Celsius for one minute. At that time, it can be found from (b) and (c) of FIG. 6 that the oxygen content was decreasing on the area of the common electrode 11, where the complex oxide film 12 had not been formed.

Next, similar to the above-described case, the self-assembled monolayer film 13 was formed on the area of the common electrode 11, where the complex oxide film 12 had not been formed, by using the self-assembled monolayer film forming apparatus 20 (cf. FIG. 2). At that time, the contact angle of water on the area of the common electrode 11, where the self-assembled monolayer film 13 had been formed but the complex oxide film 12 had not been formed, was 104 degrees both at the center portion and at the periphery. The contact angle of methoxyethanol on the area was 71 degrees both at the center portion and at the periphery. On the other hand, the contact angles of water and methoxyethanol on the other area of the common electrode 11, where the complex oxide film 12 had been formed, were 5 degrees.

Next, similar to the above-described case, the sol-gel solution 14 was applied to the area of the common electrode 11, where the self-assembled monolayer film 13 had not been formed, by using the inkjet device.

Then, the silicon wafer, to which the sol-gel solution 14 had been applied, was dried at 120 degrees Celsius, and the silicon wafer was calcined at 500 degrees Celsius. In this manner, the complex oxide film 14' having a thickness of 90 nm was additionally laminated.

Next, similar to the above-described case, the complex oxide film laminated body 15 was acid-washed. Subsequently, the laminating process of laminating the complex oxide film 14' was repeated four times, and thereby forming the complex oxide film laminated body 15 having a thickness of 640 nm. At this time, the silicon wafer, on which the complex oxide film laminated body 15 had been formed, was baked at 700 degrees Celsius by using an infrared rapid thermal annealing (IRTA) apparatus. No cracks were observed.

Further, similar to the above-described case, the complex oxide film laminated body 15 was acid-washed. Subsequently, the laminating process of laminating the complex oxide film 14' was repeated six times, and thereby forming the complex oxide film laminated body 15 having a thickness of 1180 nm. At this time, the silicone wafer, on which the complex oxide film laminated body 15 had been formed, was baked at 700 degrees Celsius by using the infrared rapid thermal annealing (IRTA) apparatus. No cracks were observed.

Next, the silicon wafer, on which the complex oxide film laminated body 15 had been formed, was washed by using isopropyl alcohol. Then, by using the sputtering method, a platinum film having a thickness of 200 nm was formed. Further, a pattern of the photo-resist TSMR8800 (produced by Tokyo Ohka Kogyo Co., Ltd.) having a thickness of 1.8 µm was formed. After that, an unnecessary portion of the platinum film was etched by the Ar/$O_2$ plasma processing, and the photo-resist was removed. In this manner, an electromechanical transducer film was obtained.

Figure 7:
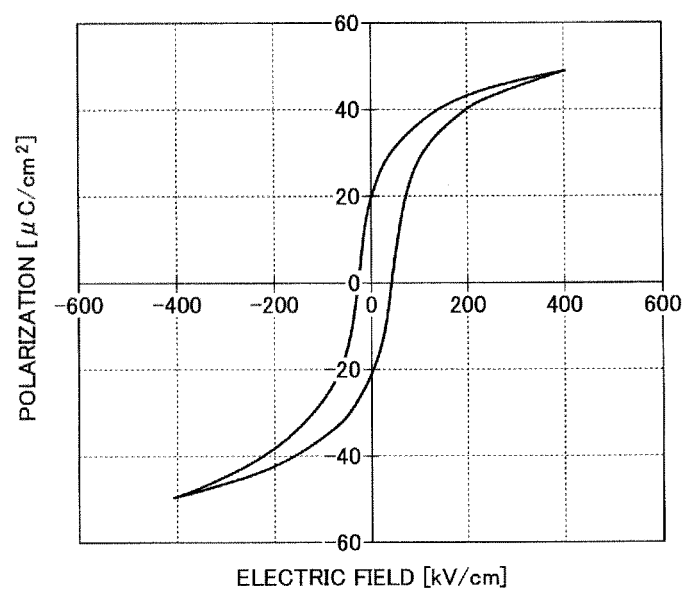
FIG. 7 is a P-E hysteresis loop of a complex oxide film laminated body according to the embodiment.

FIG. 7 shows the P-E hysteresis loop of the complex oxide film laminated body 15. From FIG. 7, the complex oxide film laminated body 15 was found to have a dielectric constant of 1220 and a dielectric loss of 0.03.

Embodiment 2

The electromechanical transducer element was obtained by the processes that were the same as those of the Embodiment 1, except that the acetic acid aqueous solution having a pH of 3.8 had been used, instead of the acetic acid aqueous solution having a pH of 3.3. The complex oxide film laminated body 15 was found to have a dielectric constant of 983 and a dielectric loss of 0.02.

Embodiment 3

The electromechanical transducer element was obtained by the processes that were the same as those of the Embodiment 1, except that hydrochloric acid having a pH of 3.3 had been used, instead of the acetic acid aqueous solution having a pH of 3.3. The complex oxide film laminated body 15 was found to have a dielectric constant of 1220 and a dielectric loss of 0.03.

Comparative Example 1

The electromechanical transducer element was obtained by the same processes of the Embodiment 1, except that the acid-washing had not been performed. The form accuracy of the complex oxide film laminated body was degraded. However, the complex oxide film laminated body was found to have a dielectric constant of 1320 and a dielectric loss of 0.02.

Table 1 shows the evaluation result of the dielectric constant and the dielectric loss of the complex oxide film laminated body according to the embodiment 1-3 and the Comparative example 1.

TABLE 1

|  | Embodiment 1 | Embodiment 2 | Embodiment 3 | Comparative example 1 |
| --- | --- | --- | --- | --- |
| Dielectric constant | 1220 | 983 | 1220 | 1320 |
| Dielectric loss | 0.03 | 0.02 | 0.03 | 0.02 |

From Table 1, it can be found that the dielectric losses of the complex oxide film laminated bodies according to the Embodiments 1-3 are less than 0.04, similar to the case of the complex oxide film laminated body according to the Comparative example 1. The complex oxide film laminated bodies according to the Embodiments 1-3 demonstrate excellent electromechanical transducing characteristics. Further, the complex oxide film laminated bodies according to the Embodiments 1-3 demonstrate the dielectric constants that are similar to the dielectric constant of the complex oxide film laminated body according to the Comparative example 1.

FIG. 8 shows a relationship between a number of processes for forming the complex oxide films (and thereby forming the complex oxide film laminated body) and a contact angle of water on the area of the common electrode 11, where the self-assembled monolayer film 13 has been formed, but the complex oxide film 12 has not been formed.

From FIG. 8, it can be found that the contact angle of water on the area of the common electrode 11, where the self-assembled monolayer 13 has been formed but the complex oxide film 12 has not been formed, is greater than 90 degrees, even if the number of forming the complex oxide films is increased and the number of processes of forming the complex oxide film laminated bodies is increased. Therefore, it can be found that the area of the common electrode 11, where the self-assembled monolayer film 13 has been formed but the complex oxide film 12 has not been formed, is hydrophobized.

On the other hand, in the Comparative example 1, the contact angle of water on the area of the common electrode 11, where the self-assembled monolayer film 13 has been formed but the complex oxide film 12 has not been formed, becomes less than 90 degrees, as the number of forming the complex oxide films is increased and the number of processes of forming the complex oxide film laminated bodies is increased. Therefore, it can be found that the area of the common electrode 11, where the self-assembled monolayer film 13 has been formed but the complex oxide film 12 has not been formed, is not hydrophobized.

In the above description, the method of manufacturing electromechanical transducer element has been explained by the embodiments. However, the present invention is not limited to the above-described embodiments, and various modifications and improvements may be made within the scope of the present invention.

The present application is based on Japanese Priority Applications No. 2011-202821 filed on Sep. 16, 2011, and No. 2012-000950 filed on Jan. 6, 2012, the entire contents of which are hereby incorporated herein by reference.

What is claimed is:

1. A method of manufacturing an electromechanical transducer element comprising:
   a first process of hydrophobizing a first area of an electrode by forming a self-assembled monolayer film on the first area, wherein a complex oxide film has been formed on a predetermined second area of the electrode, and the complex oxide film has not been formed on the first area of the electrode;
   a second process of applying a sol-gel solution onto the predetermined second area of the electrode where the self-assembled monolayer film has not been formed, wherein the sol-gel solution is adjusted to produce the complex oxide;
   a third process of producing the complex oxide by calcining the electrode to which the sol-gel solution has been applied;
   a fourth process of acid-washing the electrode on which the complex oxide has been produced;
   a fifth process of hydrophobizing, by forming the self-assembled monolayer film, the first area of the acid-washed electrode on which the complex oxide film has not been formed;
   a sixth process of applying the sol-gel solution onto the predetermined second area where the self-assembled monolayer film has not been formed; and
   a seventh process of producing the complex oxide by calcining the electrode on which the sol-gel solution has been applied.

2. The method according to claim 1,
   wherein the fourth process, the fifth process, the sixth process, and the seventh process are repeated subsequently to the seventh process.

3. The method according to claim 1,
   wherein the fourth process includes a process of spraying an acid or a solution of the acid from a first nozzle to the electrode on which the complex oxide has been produced.

4. The method according to claim 3,
   wherein a pH of the solution of the acid at 25 degrees Celsius is greater than or equal to 2 and less than or equal to 5.

5. The method according to claim 1,
   wherein the first process includes a first spraying process of spraying a thiol or a solution of the thiol from a second nozzle to the electrode, wherein the complex oxide film has been formed on the predetermined second area of the electrode, and
   wherein the fifth process includes a second spraying process of spraying the thiol or the solution of the thiol from the second nozzle to the electrode on which the complex oxide has been produced.

6. The method according to claim 5,
   wherein the first process and the fifth process include a third spraying process of spraying a cleaning solution to the electrode to which the thiol or the solution of the thiol has been sprayed, wherein ultrasonic waves have been applied the cleaning solution.

7. The method according to claim 1,
   wherein the electrode is a platinum electrode.

8. The method according to claim 1,
   wherein the complex oxide is lead zirconate titanate.

9. An electromechanical transducer element that is produced by a method comprising:
   a first process of hydrophobizing a first area of an electrode by forming a self-assembled monolayer film on the first area, wherein a complex oxide film has been formed on a predetermined second area of the electrode, and the complex oxide film has not been formed on the first area of the electrode;
   a second process of applying a sol-gel solution onto the predetermined second area of the electrode where the self-assembled monolayer film has not been formed, wherein the sol-gel solution is adjusted to produce the complex oxide;
   a third process of producing the complex oxide by calcining the electrode to which the sol-gel solution has been applied;
   a fourth process of acid-washing the electrode on which the complex oxide has been produced;
   a fifth process of hydrophobizing, by forming the self-assembled monolayer film, the first area of the acid-washed electrode on which the complex oxide film has not been formed;
   a sixth process of applying the sol-gel solution onto the predetermined second area where the self-assembled monolayer film has not been formed; and
   a seventh process of producing the complex oxide by calcining the electrode on which the sol-gel solution has been applied.

10. A discharging head that includes an electromechanical transducer element, the electromechanical transducer element being produced by a method comprising:
   a first process of hydrophobizing a first area of an electrode by forming a self-assembled monolayer film on the first area, wherein a complex oxide film has been formed on a predetermined second area of the electrode, and the complex oxide film has not been formed on the first area of the electrode;
   a second process of applying a sol-gel solution onto the predetermined second area of the electrode where the self-assembled monolayer film has not been formed, wherein the sol-gel solution is adjusted to produce the complex oxide;
   a third process of producing the complex oxide by calcining the electrode to which the sol-gel solution has been applied;
   a fourth process of acid-washing the electrode on which the complex oxide has been produced;
   a fifth process of hydrophobizing, by forming the self-assembled monolayer film, the first area of the acid-washed electrode on which the complex oxide film has not been formed;
   a sixth process of applying the sol-gel solution onto the predetermined second area where the self-assembled monolayer film has not been formed; and
   a seventh process of producing the complex oxide by calcining the electrode on which the sol-gel solution has been applied.

11. An inkjet recording device that includes a discharging head including an electromechanical transducer element, the electromechanical transducer element being produced by a method comprising:
- a first process of hydrophobizing a first area of an electrode by forming a self-assembled monolayer film on the first area, wherein a complex oxide film has been formed on a predetermined second area of the electrode, and the complex oxide film has not been formed on the first area of the electrode;
- a second process of applying a sol-gel solution onto the predetermined second area of the electrode where the self-assembled monolayer film has not been formed, wherein the sol-gel solution is adjusted to produce the complex oxide;
- a third process of producing the complex oxide by calcining the electrode to which the sol-gel solution has been applied;
- a fourth process of acid-washing the electrode on which the complex oxide has been produced;
- a fifth process of hydrophobizing, by forming the self-assembled monolayer film, the first area of the acid-washed electrode on which the complex oxide film has not been formed;
- a sixth process of applying the sol-gel solution onto the predetermined second area where the self-assembled monolayer film has not been formed; and
- a seventh process of producing the complex oxide by calcining the electrode on which the sol-gel solution has been applied.

* * * * *